United States Patent
Xu

(10) Patent No.: US 9,741,633 B2
(45) Date of Patent: Aug. 22, 2017

(54) SEMICONDUCTOR PACKAGE INCLUDING BARRIER MEMBERS AND METHOD OF MANUFACTURING THE SAME

(71) Applicant: Samsung Electronics Co., Ltd., Suwon-si, Gyeonggi-do (KR)

(72) Inventor: Jian Xu, Wuhan (CN)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/171,477

(22) Filed: Jun. 2, 2016

(65) Prior Publication Data

US 2016/0358834 A1 Dec. 8, 2016

(30) Foreign Application Priority Data

Jun. 2, 2015 (CN) .......................... 2015 1 0295917
Jan. 8, 2016 (KR) ........................ 10-2016-0002767

(51) Int. Cl.
*H01L 23/31* (2006.01)
*H01L 23/498* (2006.01)
*H01L 23/16* (2006.01)
*H01L 23/24* (2006.01)
*H01L 23/00* (2006.01)

(52) U.S. Cl.
CPC .......... *H01L 23/3142* (2013.01); *H01L 23/16* (2013.01); *H01L 23/24* (2013.01); *H01L 23/49855* (2013.01); *H01L 24/32* (2013.01); *H01L 24/73* (2013.01); *H01L 24/29* (2013.01); *H01L 24/48* (2013.01); *H01L 24/92* (2013.01); *H01L 2224/2919* (2013.01); *H01L 2224/32225* (2013.01); *H01L 2224/32238* (2013.01); *H01L 2224/48227* (2013.01); *H01L 2224/48228* (2013.01); *H01L 2224/48229* (2013.01); *H01L 2224/73265* (2013.01); *H01L 2224/92227* (2013.01); *H01L 2924/15162* (2013.01)

(58) Field of Classification Search
CPC .......... H01L 23/3142; H01L 23/49855; H01L 23/49838; H01L 23/49811
USPC ....................................................... 257/668
See application file for complete search history.

(56) References Cited

U.S. PATENT DOCUMENTS

| | | | |
|---|---|---|---|
| 6,943,437 B2 | 9/2005 | Blanc et al. | |
| 7,049,174 B2 | 5/2006 | Sakaba et al. | |
| 7,282,444 B2 | 10/2007 | Tanida et al. | |

(Continued)

FOREIGN PATENT DOCUMENTS

| | | |
|---|---|---|
| CN | 103762200 A | 4/2014 |
| CN | 203521408 U | 4/2014 |

(Continued)

*Primary Examiner* — Caleen Sullivan
(74) *Attorney, Agent, or Firm* — Ward and Smith, P.A.

(57) ABSTRACT

A semiconductor package can include a semiconductor chip on a substrate inside the semiconductor package and an electrode pad spaced apart from the semiconductor chip on the substrate inside the semiconductor package. A wire can be inside the semiconductor package, to connect the electrode pad to the semiconductor chip and a barrier member can be on the substrate fencing-in the semiconductor chip, where the electrode pad and the wire can be in an interior portion of the substrate. A sealing material can be in the interior portion of the substrate fenced-in by the barrier member, where the sealing material covering the semiconductor chip, the electrode pad, and the wire.

17 Claims, 19 Drawing Sheets

(56) References Cited

U.S. PATENT DOCUMENTS

| | | | |
|---|---|---|---|
| 7,982,295 | B2 | 7/2011 | Kobayashi et al. |
| 2010/0258946 | A1* | 10/2010 | Uchiyama ............ H01L 21/486 |
| | | | 257/774 |
| 2011/0275177 | A1 | 11/2011 | Yim et al. |
| 2014/0175502 | A1 | 6/2014 | Chiu |

FOREIGN PATENT DOCUMENTS

| | | |
|---|---|---|
| JP | 11-338995 A | 12/1999 |
| JP | 11-354554 | 12/1999 |
| JP | 2002-312744 | 10/2002 |
| JP | 2004-112031 A | 4/2004 |
| JP | 2005-167093 A | 6/2005 |
| JP | 4962563 | 6/2012 |
| KR | 10-2001-0023809 A | 3/2001 |
| KR | 10-2001-0037606 A | 5/2001 |
| KR | 10-0719973 B1 | 5/2007 |
| WO | WO 2008/117382 A1 | 10/2008 |

* cited by examiner

US 9,741,633 B2

SEMICONDUCTOR PACKAGE INCLUDING BARRIER MEMBERS AND METHOD OF MANUFACTURING THE SAME

CROSS-REFERENCE TO RELATED APPLICATIONS

This application claims the benefit of State Intellectual Property Office (SIPO) of the People's Republic of China No. 201510295917.3, filed on Jun. 2, 2015, in State Intellectual Property Office (SIPO) of the People's Republic of China and Korean Patent Application No. 10-2016-0002767, filed on Jan. 8, 2016, in the Korean Intellectual Property Office, the disclosures of which are incorporated herein in their entireties by reference.

FIELD

The inventive concept relates to a semiconductor package and a method of manufacturing the same, and more particularly, to a semiconductor package capable of providing a structural stability and method of manufacturing the semiconductor package.

BACKGROUND

A semiconductor package may include a sealing member that surrounds a semiconductor chip to protect the semiconductor chip from an external environment. Accordingly, dimensions and structural stability of the semiconductor package may be affected by the sealing member.

SUMMARY

In some embodiments, a semiconductor package can include a semiconductor chip on a substrate inside the semiconductor package and an electrode pad spaced apart from the semiconductor chip on the substrate inside the semiconductor package. A wire can be inside the semiconductor package, to connect the electrode pad to the semiconductor chip and a barrier member can be on the substrate fencing-in the semiconductor chip, where the electrode pad and the wire can be in an interior portion of the substrate. A sealing material can be in the interior portion of the substrate fenced-in by the barrier member, where the sealing material covering the semiconductor chip, the electrode pad, and the wire.

In some embodiments, a semiconductor package can include a substrate, a first bonding member on the substrate, a second bonding member on the substrate and spaced apart from the first bonding member to surround the first bonding member, a semiconductor chip on the first bonding member, a barrier member on the second bonding member to surround the semiconductor chip, a groove defined by a space bounded by the first bonding member, the second bonding member, the barrier member, and the substrate, and a sealing member in the groove to seal the first bonding member and the semiconductor chip in the space.

In some embodiments, a semiconductor package can include a substrate and a semiconductor chip on the substrate. An integral solder structure can be provided on the substrate to surround the semiconductor chip and a sealing member can be provided to seal the semiconductor chip in a space between the substrate and the integral solder structure.

BRIEF DESCRIPTION OF THE DRAWINGS

Embodiments of the inventive concept will be more clearly understood from the following detailed description taken in conjunction with the accompanying drawings in which.

DETAILED DESCRIPTION OF EMBODIMENTS

Figure 1A:
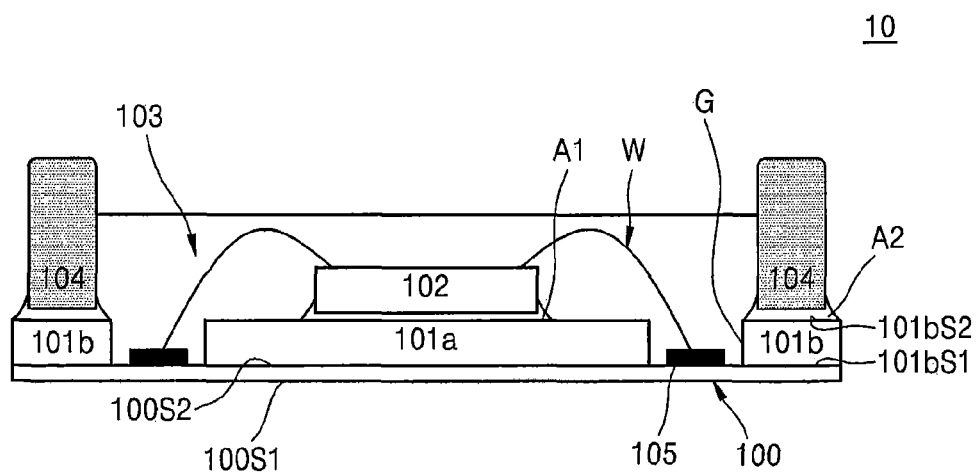
FIGS. 1A and 1B are respectively a cross-sectional view and a plan view of a semiconductor package according to embodiments.

Hereinafter, embodiments will be described with reference to the accompanying drawings. Like reference numerals denote like elements throughout the specification and drawings, and redundant descriptions thereof will be omitted.

Embodiments may be embodied in many different forms and should not be construed as being limited to the embodiments set forth herein; rather, these embodiments are provided so that this disclosure will be thorough and complete, and will fully convey the inventive concept to those of ordinary skill in the art. As used herein, the term "and/or" includes any and all combinations of one or more of the associated listed. Expressions such as "at least one of," when preceding a list of elements, modify the entire list of elements and do not modify the individual elements of the list.

In the accompanying drawings, the modifications of the illustrated shapes may be expected according to manufacturing technologies and/or tolerance. Therefore, the embodiments should not be construed as being limited to specific shapes of the illustrated regions. The shapes may be changed during the manufacturing processes.

When a certain embodiment may be implemented differently, a specific process order may be performed differently from the described order. For example, two consecutively described processes may be performed substantially at the same time or performed in an order opposite to the described order.

The terminology used herein is for the purpose of describing particular embodiments only and is not intended to limit the scope of the inventive concept. As used herein, the singular forms "a", "an", and "the" are intended to include the plural forms as well, unless the context clearly indicates otherwise. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Unless otherwise defined, all terms (including technical and scientific terms) used herein have the same meaning as commonly understood by those of ordinary skill in the art to which the inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Also, though terms "first", "second", etc. are used to describe various members, components, regions, layers, and/or portions in various embodiments of the inventive concept, the members, components, regions, layers, and/or portions are not limited to these terms. These terms do not mean a specific order, an up-and-down order, or superiority and are used only to differentiate one member, component, region, layer, or portion from another one. Therefore, a first member, a first component, a first region, a first layer, or a first portion in an embodiment may refer to a second member, a second component, a second region, a second layer, or a second portion in another embodiment. For example, a first element may be referred to as a second element without departing from the scope of the inventive concept. Similarly, a second element may be referred to as a first element.

Since various elements and regions in the drawings are schematically illustrated, the inventive concept is not limited to a relative size or spacing illustrated in the accompanying drawings.

Figure 1B:
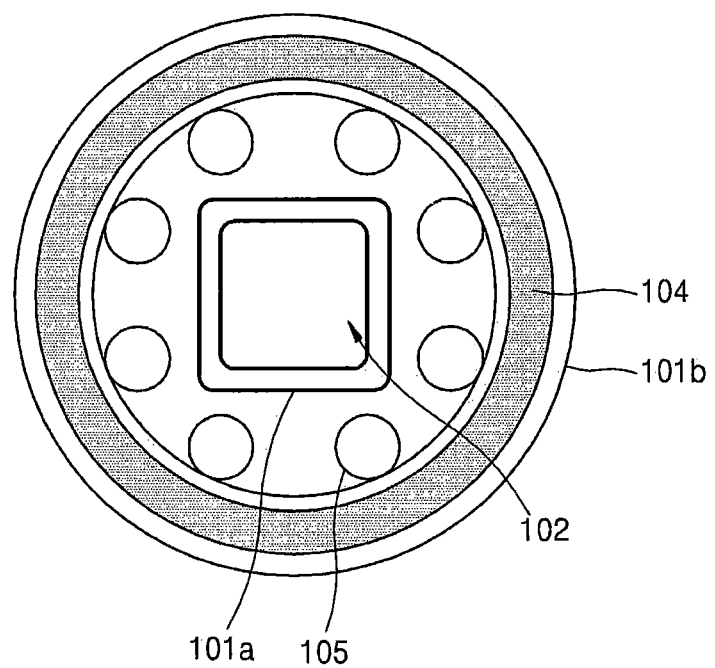

FIGS. 1A and 1B are respectively a cross-sectional view and a plan view of a semiconductor package 10 according to embodiments.

Referring to FIGS. 1A and 1B, the semiconductor package 10 may include a substrate 100, first and second bonding members 101a and 101b and an electrode pad 105 on the substrate 100, a semiconductor chip 102 on the first bonding member 101a, a barrier member 104 on the second bonding member 101b, a lead wire W that connects the semiconductor chip 102 to the electrode pad 105, and a sealing member 103 in a space laterally defined on the substrate 100 by opposite portions of the barrier member 104.

Specifically, the substrate 100 may include a first surface 100S1 and a second surface 100S2 opposite to the first surface 100S1. The substrate 100 may be a printed circuit board (PCB). Although not illustrated, external connection terminals may be on the first surface 100S1 of the substrate 100. The semiconductor chip 102 may be on the second surface 100S2 of the substrate 100.

The first and second bonding members 101a and 101b having a certain thickness may be on the second surface 100S2 of the substrate 100. The second bonding member 101b may include a first surface 101bS1 facing the substrate 100, and a second surface 101bS2 opposite to the first surface 101bS1. The second surface 101bS2 of the second bonding member 101b may be planar, but is not limited thereto. The second surface 101bS2 of the second bonding member 101b may have a concave-convex shape. Alternatively, the second surface 101bS2 of the second bonding member 101b may have a concave shape so as to accommodate the barrier member 104 entirely or partially.

The second bonding member 101b may be disposed on the substrate 100 to surround (or fence-in) the first bonding member 101a. Accordingly, the second bonding member 101b may have a ring shape, but is not limited thereto.

The first bonding member 101a and the second bonding member 101b may be spaced apart from each other in at least a partial region. Accordingly, a groove G may be provided along a space defined between first and second bonding members 101a and 101b spaced apart from each other. The top surface (i.e., the second surface 100S2) of the substrate 100 may be partially exposed in the groove G.

The electrode pad 105 may be on the top surface (i.e., the second surface 100S2) of the substrate 100 that is exposed in the groove G. The electrode pad 105 may be electrically connected to the semiconductor chip 102 through the lead wire W. In this case, a depth of the groove G may be greater than a thickness of the electrode pad 105. Therefore, the lead wire W may pass the groove G and be connected to the electrode pad 105. The sealing member 103 may fill the groove G and seal the electrode pad 105 and the lead wire W.

Figure 9:
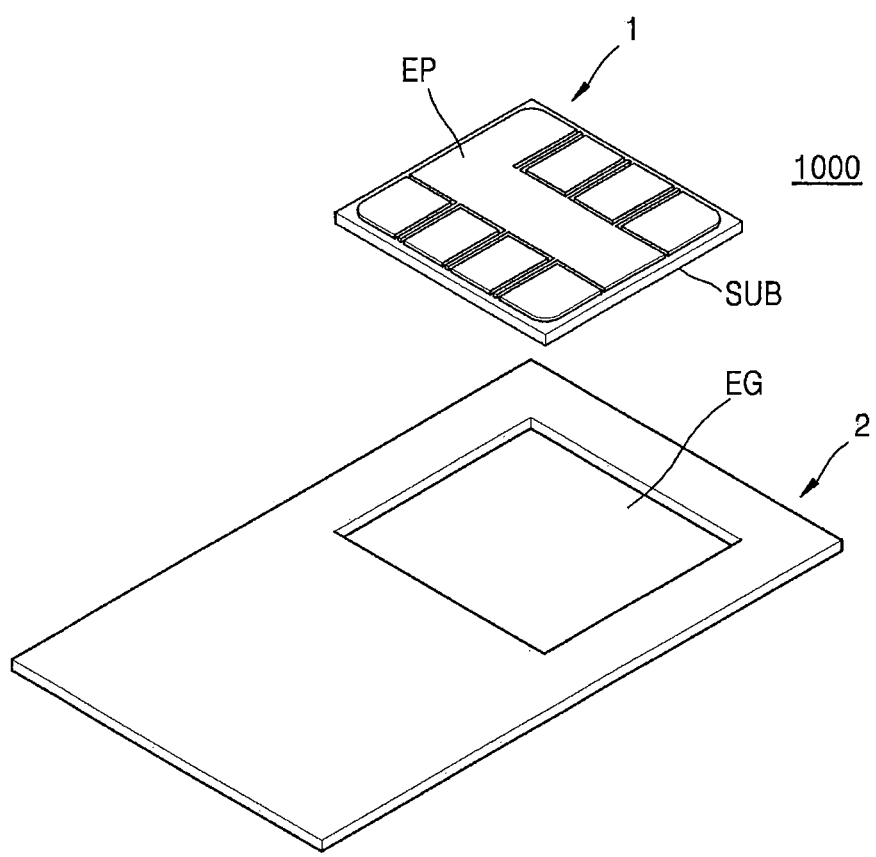
FIG. 9 is a perspective view of a smart card including a semiconductor package, according to embodiments.

The electrode pad 105 may be electrically connected to the external connection terminal on the first surface 100S1 of the substrate 100. In FIG. 9, an external connection terminal EP is illustrated as being on a first surface of a substrate SUB. The semiconductor chip 102 and the electrode pad 105 are disposed on a second surface opposite to the first surface of the substrate SUB on which the external connection terminal EP is disposed.

A plurality of electrode pads 105 may be within the groove G, and at least some of the plurality of electrode pads 105 may be electrically connected to the semiconductor chip 102.

The semiconductor chip 102 may be on the first bonding member 101a. The semiconductor chip 102 may be fixed to the first bonding member 101a by an adhesive layer A1 including a glue.

In some embodiments, the first bonding member 101a may be omitted. That is, the semiconductor chip 102 may be directly fixed to the substrate 100 by the adhesive layer A1. In this case, the adhesive layer A1 may serve as the first bonding member 101a. In other embodiments, the adhesive layer A1 may be omitted. In this case, the first bonding member 101a may include a glue and directly fix the semiconductor chip 102 to the substrate 100.

The barrier member 104 may be on the second bonding member 101b. The barrier member 104 may be fixed to the second bonding member 101b by an adhesive layer A2 including a glue.

In some embodiments, the second bonding member 101b may be omitted. In this case, the barrier member 104 may be directly fixed to the substrate 100 by the adhesive layer A2. In other embodiments, the adhesive layer A2 may be omitted. In this case, the second bonding member 101b may include a glue and directly fix the barrier member 104 to the substrate 100.

The barrier member 104 may have various shapes so as to surround the semiconductor chip 102. For example, referring to FIG. 1B, the barrier member 104 may have a ring shape. When the barrier member 104 has a ring shape, the semiconductor chip 102 may be in a central portion of the ring-shaped barrier member 104.

In addition, the second bonding member 101b may have a shape matching the barrier member 104. In some embodiments, the second bonding member 101b may have a ring shape corresponding to the barrier member 104, so that the barrier member 104 is stacked on the second bonding member 101b. However, the second bonding member 101b is not limited thereto. The second bonding member 101b may have various shapes so that the barrier member 104 is on the second bonding member 101b.

The barrier member 104 may be disposed like a ring-shaped dam to fence-in the chip 102. The barrier member 104 may accommodate the sealing member 103 in the space laterally defined by opposing portions of the barrier member 104.

In order to adjust a volume of the semiconductor package 10, a height of the barrier member 104 may be appropriately adjusted according to process requirements. However, even in this case, the height of the barrier member 104 may be appropriately determined so that the sealing member 103 seals the semiconductor chip 102, the electrode pad 105, and the lead wire W. Therefore, a level of the top surface of the barrier member 104 on the second bonding member 101b may be determined to be higher than a maximum level of the lead wire W.

As described above, the sealing member 103 may be in the space defined by the second bonding member 101b and the barrier member 104. The sealing member 103 may seal the semiconductor chip 102, the electrode pad 105, the first bonding member 101a, and the lead wire W in the space laterally defined by the second bonding member 101b and the barrier member 104. In some embodiments, the sealing member 103 may include a glue to seal the semiconductor chip 102, the first bonding member 101a, and the lead wire W in the space defined by the second bonding member 101b and the barrier member 104. In this case, the sealing member 103 may be formed by a dotting process.

In some embodiments, the barrier member 104 may include a plurality of separate barrier elements. Ends of the plurality of separate barrier elements may be connected to one another to constitute the barrier member 104 (having a continuous shape) in a lateral direction, for example, a ring shape.

The barrier member 104 may be formed by connecting the plurality of separate barrier elements to one another through an adhesive layer including a glue. In this case, boundaries may appear between the plurality of separate barrier elements.

On the other hand, the barrier member 104 may be formed by integrally connecting the plurality of separate barrier elements to one another through a solder print process and a reflow process. In the barrier member 104 formed through the solder print process and the reflow process, no boundaries may appear between the plurality of barrier members. The barrier member 104 may have an integrated (or continuous) shape as illustrated in FIGS. 1A and 1B. The barrier member 104 including the plurality of separate barrier elements may provide a space for accommodating the sealing member 103.

The plurality of separate barrier elements may be a plurality of separate ring-shaped structures. The barrier member 104 may be formed by stacking the plurality of separate ring-shaped structures. (See FIG. 4) In addition, the plurality of separate barrier elements may be a plurality of separate non-ring-shaped structures. The barrier member 104 may be formed by connecting sides of the plurality of separate non-ring-shaped structures to one another. (See FIG. 5)

The barrier member 104 may be a pre-manufactured ring-shaped structure. In some embodiments, the barrier member 104 may include at least one selected from a ceramic, plastic, a metal, and a solder. Since the ceramic, the plastic, the metal, and the solder have excellent mechanical strengths, the barrier member 104 including at least one selected from the ceramic, the plastic, the metal, and the solder may protect the electrode pad 105, the semiconductor chip 102, the lead wire W, and the sealing member 103 from being damaged by external impact.

A cross-section of the barrier member 104 is illustrated as having a rectangular shape, but is not limited thereto. The cross-section of the barrier member 104 may have various shapes. For example, the cross-section of the barrier member 104 may have a rectangular shape or a bullet shape.

Figure 2:
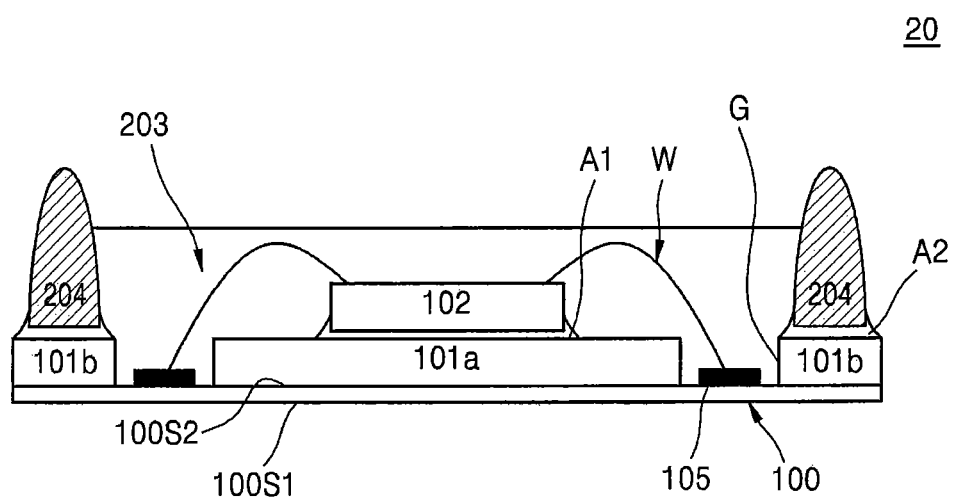
FIG. 2 is a cross-sectional view of a semiconductor package according to embodiments.

FIG. 2 is a cross-sectional view of a semiconductor package 20 according to embodiments. The semiconductor package 20 of FIG. 2 is similar to the semiconductor package 10 of FIGS. 1A and 1B, except for a cross-sectional shape of a barrier member 204.

Referring to FIG. 2, the cross-section of the barrier member 204 may have various shapes. The cross-section of the barrier member 104 of FIG. 1A has a rectangular shape, but the cross-section of the barrier member 204 of FIG. 2 may have a bullet shape. That is, the cross-section of the barrier member 204 may have a dome shape (at an end remote from the substrate 100) that has a uniform thickness in a lower portion thereof and becomes gradually narrower (i.e., tapers) toward an upper portion thereof.

The barrier member 204 having the bullet-shaped cross-section may be a pre-manufactured separate ring-shaped structure. The pre-manufactured separate ring-shaped structure may include at least one selected from a ceramic, plastic, and a metal.

A sealing member 203 may be disposed in a space laterally defined by a second bonding member 101b and the barrier member 204. Like the sealing member 103 of FIG. 1A, the sealing member 203 may seal a semiconductor chip 102, an electrode pad 105, a first bonding member 101a, and a lead wire W.

Figure 3A:
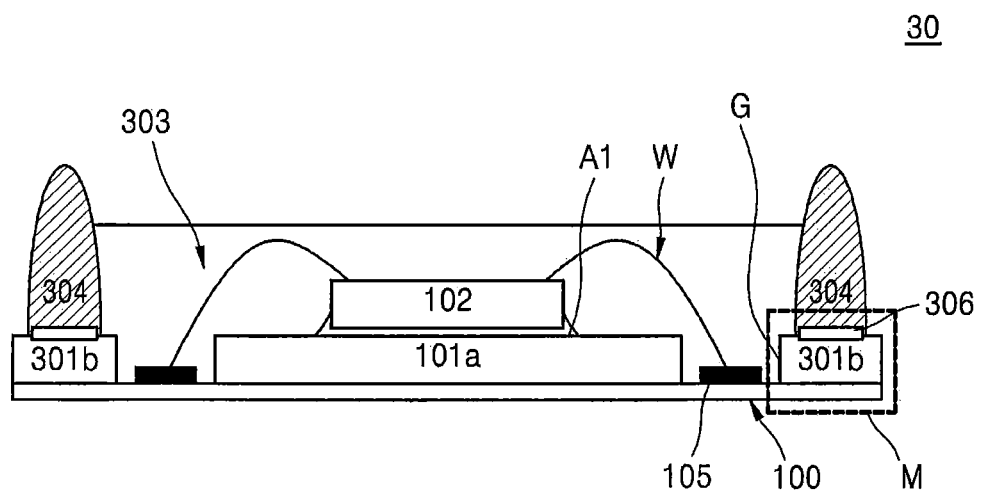
FIG. 3A is a cross-sectional view of a semiconductor package according to embodiments.
Figure 3B:
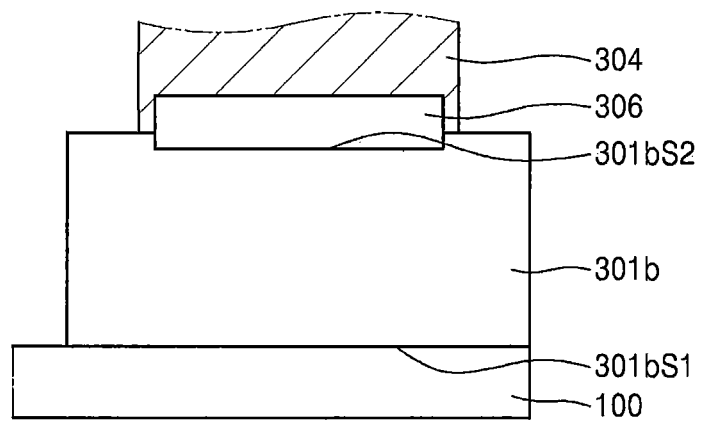
FIG. 3B is an enlarged cross-sectional view of a portion M of FIG. 3A.

FIGS. 3A and 3B are cross-sectional views of a semiconductor package 30 according to embodiments. The semiconductor package 30 of FIGS. 3A and 3B is similar to the semiconductor package 10 of FIGS. 1A and 1B, except for a material and a shape of a barrier member 304 and a connection member that connects the barrier member 304 to a second bonding member 301b. The barrier member 304 may be a solder, and the barrier member 304 may be connected to the second bonding member 301b by a metal pattern layer 306. FIG. 3B is an enlarged cross-sectional view of a portion M of FIG. 3A.

Referring to FIG. 3A, the semiconductor package 30 may include a substrate 100, first and second bonding members 101a and 301b and an electrode pad 105 on the substrate 100, a semiconductor chip 102 on the first bonding member 101a, the barrier member 304 on the second bonding members 301b, a lead wire W that connects the semiconductor chip 102 to the electrode pad 105, and a sealing member 303 in a space laterally defined by the barrier member 304.

The second bonding member 301b may surround the first bonding member 101a. A groove G may be formed along a space defined by the first and second bonding members 101a and 301b spaced apart from each other. The electrode pad 105 may be on a top surface of the substrate 100 that is exposed through the groove G.

The barrier member 304 may include a solder material such as a tin solder. The barrier member 304 may be formed through a reflow process after a solder print process. A cross-section of the barrier member 304 may be deformed to have a bullet shape by the reflow process, but is not limited thereto.

In some embodiments, the barrier member 304 may be formed by integrally connecting a plurality of elements to one another. For example, the barrier member 304 may be formed in such a manner that a plurality of solders formed using a plurality of elements by a solder print process are made to have an integrated shape by a reflow process. The elements can be separate elements.

The second bonding member 301b may include a first surface 301bS1 facing the substrate 100, and a second surface 301bS2 opposite to the first surface 301bS1 and facing the barrier member 304. In this case, in order to fix the barrier member 304 to the second bonding member 301b, the metal pattern layer 306 may be on the second surface 301bS2 of the second bonding member 301b.

The metal pattern layer 306 may include copper, but is not limited thereto. The metal pattern layer 306 may include any metal and/or an alloy formed by bonding the second bonding member 301b and the barrier member 304.

The second surface 301bS2 of the second bonding member 301b, on which the metal pattern layer 306 is formed, may have a planar shape, but is not limited thereto. The second surface 301bS2 of the second bonding member 301b may have a concave-convex shape. For example, a region overlapping the metal pattern layer 306 on the second surface 301bS2 of the second bonding member 301b may have a concave shape to accommodate the metal pattern layer 306 entirely or partially.

The second bonding member 301b may include a glue and be fixed on the substrate 100, but is not limited thereto. In some embodiments, the second bonding member 301b may be omitted. In this case, the metal pattern layer 306 may be directly fixed to the substrate 100 by an adhesive layer including a glue. In this case, the adhesive layer may serve as the second bonding member 301b.

In order to fix the barrier member 304 to the second bonding member 301b, the metal pattern layer 306 is used in the embodiment of FIG. 3, but is not limited thereto. The barrier member 304 may be fixed to the second bonding member 301b by an adhesive layer including a glue.

Figure 4:
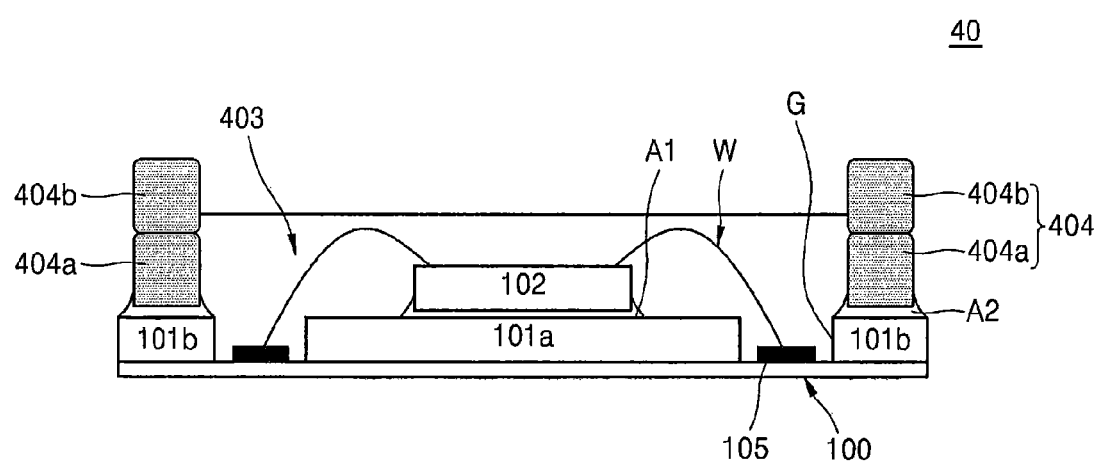
FIG. 4 is a cross-sectional view of a semiconductor package according to embodiments.

FIG. 4 is a cross-sectional view of a semiconductor package 40 according to embodiments. The semiconductor package 40 of FIG. 4 is similar to the semiconductor package 10 of FIGS. 1A and 1B, except that a barrier member 404 includes a plurality of stacked barrier elements, such as first and second ring-shaped structures 404a and 404b.

Referring to FIG. 4, the barrier member 404 may include the plurality of stacked barrier elements. The plurality of stacked barrier elements may be the first and second ring-shaped structures 404a and 404b. In this case, the barrier member 404 may be formed by stacking the first and second ring-shaped structures 404a and 404b.

In this case, the first and second ring-shaped structures 404a and 404b may be connected to each other by an adhesive layer including a glue. The barrier member 404 formed using the plurality of stacked barrier elements may provide a space for accommodating a sealing member 403.

The barrier member 404 is illustrated in FIG. 4 as being formed by stacking two ring-shaped structures, i.e., the first and second ring-shaped structures 404a and 404b, but is not limited thereto. In some embodiments, the barrier member 404 may be formed by stacking three or more ring-shaped structures. The stacked barrier members may be different sizes and may not be vertically designed.

Figure 5A:
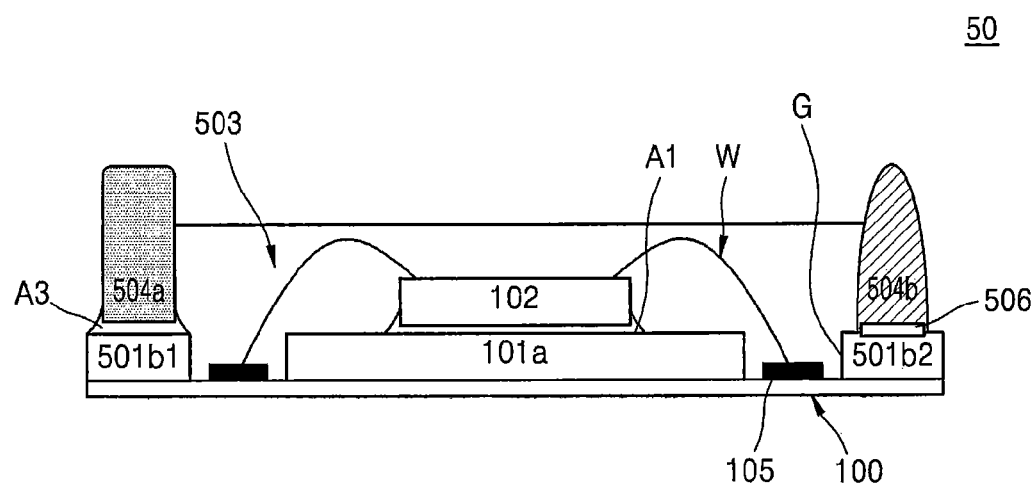
FIGS. 5A to 5C are respectively a cross-sectional view and plan views of semiconductor packages according to embodiments.
Figure 5B:
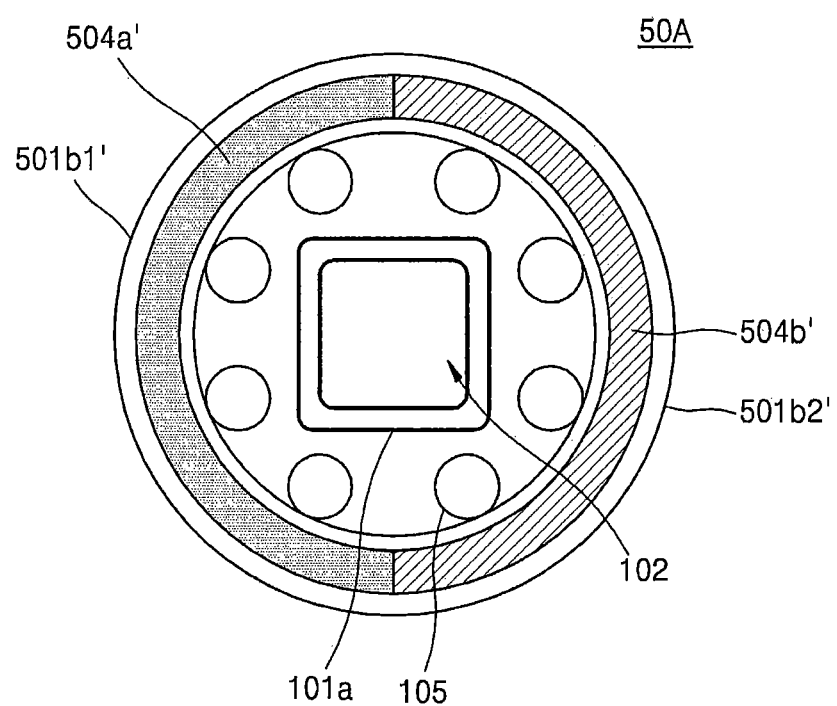
Figure 5C:
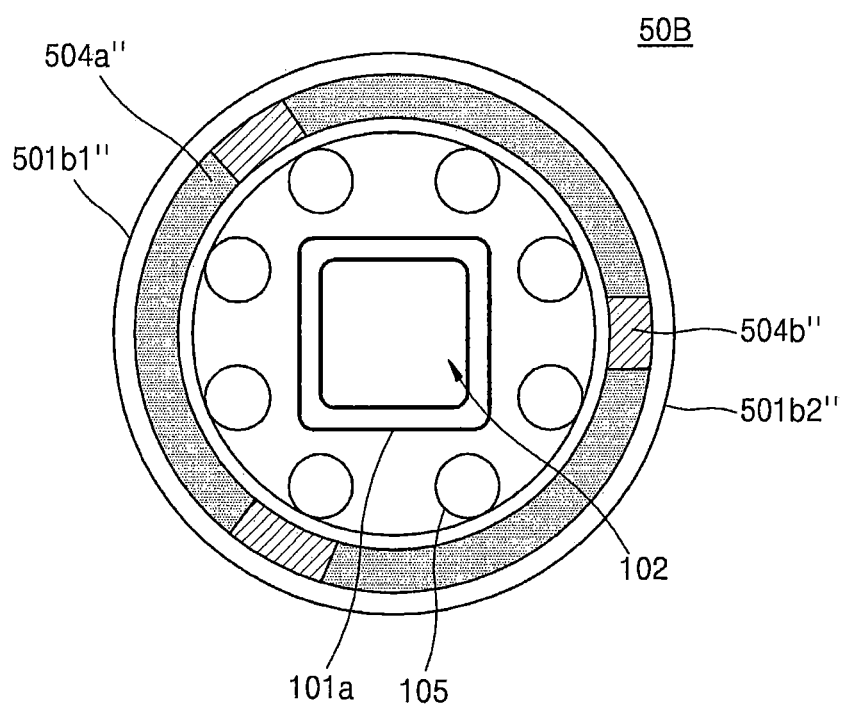

FIGS. 5A to 5C are respectively a cross-sectional view and plan views of semiconductor packages 50, 50A, and 50B according to embodiments. The semiconductor packages 50, 50A, and 50B of FIGS. 5A to 5C are similar to the semiconductor package 10 of FIGS. 1A and 1B, except that barrier members 504a and 504b, 504a' and 504b', and 504a" and 504b" are formed using a plurality of separate barrier elements, such as arc-shaped structures. The barrier members 504a and 504b, 504a' and 504b', and 504a" and 504b" respectively included in the semiconductor packages 50, 50A, and 50B of FIGS. 5A to 5C may be a combination of the barrier member 104 illustrated in FIGS. 1A and 1B and of the barrier member 304 illustrated in FIGS. 3A and 3B.

Referring to FIG. 5A, the barrier members 504a and 504b may include a plurality of separate barrier elements, i.e., a first barrier element 504a and a second barrier element 504b. Ends of the first and second barrier elements 504a and 504b may be connected to each other to form a shape isolated in a lateral direction. In this case, the first and second barrier elements 504a and 504b may be connected to each other by an adhesive layer including a glue, or may be integrally connected to each other through a reflow process.

Cross-sections of the first and second barrier elements 504a and 504b may have different shapes. For example, the cross-section of the first barrier element 504a may have a rectangular shape and the cross-section of the second barrier element 504b may have a bullet shape.

In addition, the first barrier element 504a and the second barrier element 504b may be formed using different materials. For example, the first and second barrier elements 504a and 504b may include at least one material selected from a ceramic, plastic, a metal, and an alloy. In this case, the material selected for the first barrier element 504a may be different from the material selected for the second barrier element 504b.

Furthermore, the first barrier element 504a and the second barrier element 504b may be formed by different manufacturing methods. For example, the first barrier element 504a may be a pre-manufactured independent dam-shaped structure. In this case, the first barrier element 504a may be fixed to a second bonding member 501b1, corresponding to the first barrier element 504a, by an adhesive layer A3.

On the other hand, the second barrier element 504b may be a solder formed by a solder print process and a reflow process. For example, the second barrier element 504b may be a tin solder. In this case, the second barrier element 504b may be fixed to the second bonding member 501b2, corresponding to the second barrier element 504b, by a metal pattern layer 506. In some embodiments, the second barrier element 504b may be fixed to the second bonding member 501b2 by an adhesive layer including a glue.

The metal pattern layer 506 may include an alloy formed by bonding the second barrier element 504b and the second bonding member 501b2 and/or other metals.

Top surfaces of the second bonding members 501b1 and 501b2 may have a planar shape, but are not limited thereto. The top surfaces of the second bonding members 501b1 and 501b2 may have a concave-convex shape. In particular, the top surface of the second bonding member 501b1 overlapping the first barrier element 504a may have a planar shape, and the top surface of the second bonding member 501b2 overlapping the second barrier element 504b may have a concave shape to accommodate the metal pattern layer 506 entirely or partially.

An end of the first barrier element 504a and an end of the second barrier element 504b may be connected to each other to form a space isolated in a lateral direction. That is, the first and second barrier elements 504a and 504b may provide a space for accommodating the sealing member 503.

The first and second barrier elements 504a and 504b may be arc-shaped structures. That is, ends of the arc-shaped structures constituting the first and second barrier elements 504a and 504b may be connected to each other to form a ring-shaped structure.

For example, the barrier members 504a and 504b, 504a' and 504b', and 504a" and 5041b" respectively illustrated in FIGS. 5A to 5C may be a combination of pre-manufactured independent dam-shaped structures and solder structures.

The first and second arc-shaped structures 504a' and 504b' of FIG. 5B may correspond to the first and second barrier elements 504a and 504b of FIG. 5A, respectively. Each of the first and second arc-shaped structures 504a' and 504b' may have a semicircular shape, but is not limited thereto. The first and second arc-shaped structures 504a' and 504b', which have different cross-sectional shapes and/or include different materials, may occupy different areas. That is, a perimeter ratio of the first arc-shaped structure 504a' to the second arc-shaped structure 504b' may be variously designed according to process requirements.

Specific regions occupied by second bonding members 501b1' and 501b2' and a metal pattern layer 506 may vary according to specific dimensions of the first and second arc-shaped structures 504a' and 504b'.

Ends of the first and second arc-shaped structures 504a' and 504b' may be connected to each other to form a unitary ring-shaped structure. A sealing member 503 may be accommodated in a space laterally defined by the ring-shaped structure.

The plurality of first and second arc-shaped structures 504a" and 504b" of FIG. 5C may correspond to the first and second barrier elements 504a and 504b of FIG. 5A, respectively. A length of the plurality of first arc-shaped structures 504a" may be greater than a length of the plurality of second arc-shaped structures 504b".

Ends of the plurality of first and second arc-shaped structures 504a" and 504b" may be connected to each another to form a ring-shaped structure. A sealing member 503 may be accommodated in a space laterally defined by the ring-shaped structure.

The first and second arc-shaped structures 504a" and 500b" are illustrated in FIG. 5C as each including two or more arc-shaped structures and being alternately arranged and connected to one another, but are not limited thereto.

According to a configuration of a conventional semiconductor package as appreciated by the present inventor, a semiconductor chip, an electrode pad, and a lead wire on a substrate may be sealed by a sealing member. A sealing process may be performed by using a dotting process, but it may be difficult to control a shape and a dimension of the semiconductor package or to ensure a structural stability of the semiconductor package. In addition, when the sealing process is performed by molding, the electrode pad, the lead wire, or the like may be delaminated from the substrate due to a low binding force between a filling material and the substrate, thus degrading the reliability of the semiconductor package.

In contrast, the semiconductor packages 10, 20, 30, 40, 50, 50A, and 50B according to the present embodiments herein, may provide the space for accommodating the sealing member that seals the semiconductor chip, the electrode pad, and the lead wire by arranging the barrier member that surrounds the semiconductor chip, the electrode pad, and the lead wire. Therefore, the accuracy of the dimensions of the semiconductor package may be ensured and the sealing member may be protected by the barrier member, thus effectively improving the mechanical strength of the semiconductor package. In addition, the use of the glue as the material of the sealing member may make it possible to suppress the delamination of the electrode pad, the lead wire, or the like while controlling the shape and the dimensions of the semiconductor package, thus ensuring the driving reliability of the semiconductor package.

Figure 6A:
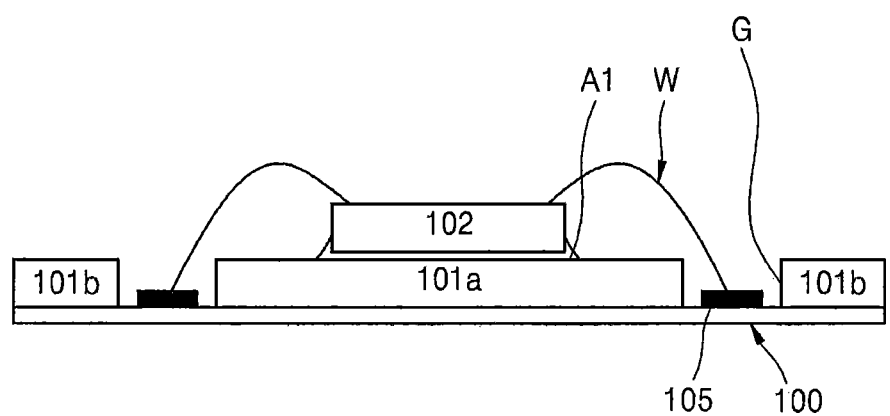
FIGS. 6A to 6C are cross-sectional views illustrating a method of manufacturing the semiconductor package illustrated in FIGS. 1A and 1B.
Figure 6B:
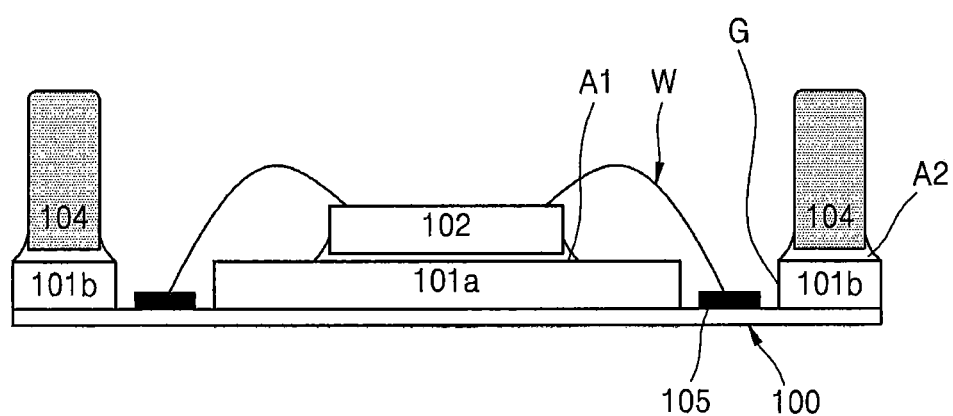
Figure 6C:
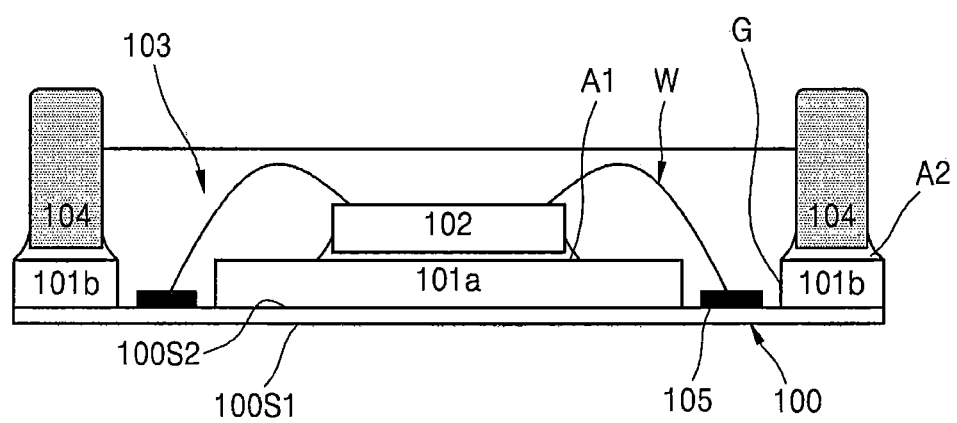

FIGS. 6A to 6C are cross-sectional views for describing a method of manufacturing the semiconductor package 10 illustrated in FIGS. 1A and 1B. A method of manufacturing the semiconductor package 20 illustrated in FIG. 2 is described with reference to FIGS. 6A to 6C.

Referring to FIG. 6A, a semiconductor chip 102 may be disposed on a substrate 100. In this case, after a first bonding member 101a is disposed on the substrate 100, the semiconductor chip 102 may be disposed on the first bonding member 101a. An adhesive layer A1 may be disposed on the first bonding member 101a so as to fix the semiconductor chip 102 to the first bonding member 101a, but the present embodiment is not limited thereto. That is, various bonding methods may be used for fixing the semiconductor chip 102 to the substrate 100. In some embodiments, the first bonding member 101a may be omitted, and the semiconductor chip 102 may be directly fixed to the substrate 100 by the adhesive layer A1. Alternatively, the first bonding member 101a may be a glue in itself. In this case, the adhesive layer A1 may be omitted, and the semiconductor chip 102 may be directly fixed to the substrate 100 via the first bonding member 101a.

A second bonding member 101b may be spaced apart from the first bonding member 101a in at least a partial region of the substrate 100 while surrounding the first bonding member 101a. Accordingly, a groove G may be formed along a lateral space defined between the first bonding member 101a and the second bonding member 101b spaced apart from each other. An electrode pad 105 may be formed on the substrate 100, and the electrode pad 105 may be exposed through the groove G. The electrode pad 105 may be electrically connected to an external connection terminal of the semiconductor package 10. The elements described above may be formed in any order.

Referring to FIG. 6B, a barrier member 104 may be formed on the second bonding member 101b. In this case, an adhesive layer A2 may be formed on the second bonding member 101b to fix the barrier member 104 to the second bonding member 101b. The adhesive layer A2 may be disposed or coated on the second bonding member 101b, and the barrier member 104 may be disposed on the adhesive layer A2.

A curing process may be performed to fix the barrier member 104 to the second bonding member 101b. However, the present embodiment is not limited thereto. Various bonding methods may be used for fixing the barrier member 104 to the substrate 100. In some embodiments, the second bonding member 101b may be omitted, and the barrier member 104 may be directly fixed to the substrate 100 by the adhesive layer A2. Alternatively, the second bonding member 101b may be a glue in itself. In this case, the adhesive layer A2 may be omitted, and the barrier member 104 may be directly fixed to the substrate 100 via the second bonding member 101b.

The barrier member 104 may be a pre-manufactured independent structure that surrounds the semiconductor chip 102. For example, the barrier member 104 may be a pre-manufactured independent ring-shaped structure. When the barrier member 104 has a ring shape, the semiconductor chip 102 may be disposed in a central portion of the ring-shaped barrier member 104. In addition, the second bonding member 101b may have a shape matching the barrier member 104. For example, when the barrier member 104 has a ring shape, the second bonding member 101b may be formed to have a ring shape so that the barrier member 104 is formed on the second bonding member 101b.

The semiconductor chip 102 may be connected to the electrode pad 105 through a wire bonding process. The semiconductor chip 102 may be electrically connected to the electrode pad 105 through a lead wire W. A plurality of electrode pads 105 may be formed on the substrate 100. At least some of the plurality of electrode pads 105 may be electrically connected to the semiconductor chip 102 through a plurality of lead wires W.

A sealing member 103 may be formed in a space laterally defined by the substrate 100, the second bonding member 101b, and the barrier member 104 to seal the semiconductor chip 102, the electrode pad 105, the first bonding member 101a, and the lead wire W. Since the sealing member 103 is supported by the groove G and the barrier member 104, the dimensions of the semiconductor package 10 may be controlled and the semiconductor package 10 may be strengthened against external impact. In addition, since the sealing member 103 is stably fixed, it is possible to suppress delamination between the electrode pad 105 and the substrate 100 and between the electrode pad 105 and the lead wire W.

In some embodiments, the sealing member 103 may be a glue. In this case, the sealing member 103 may be formed in such a manner that a glue is formed through a dotting process in the space laterally defined by the second bonding member 101b and the barrier member 104. In other embodiments, the sealing member 103 may be a general molding material. In this case, the sealing member 103 may be formed in such a manner that a molding material is formed through a molding process in the space laterally defined by the second bonding member 101b and the barrier member 104. In this manner, the semiconductor package 10 of FIGS. 1A and 1B may be manufactured.

The method of manufacturing the semiconductor package 20 illustrated in FIG. 2 may be similar to the method of FIGS. 6A to 6C, except for a shape of a barrier member 204 on the second bonding member 101b. The barrier member 204 may be a pre-manufactured independent ring-shaped structure. The ring-shaped structure may be manufactured to have a bullet-shaped cross-section rather than a rectangular cross-section.

The barrier member 204 of the pre-manufactured independent ring-shaped structure may be disposed on the second bonding member 101b, and the sealing member 203 may be formed in the space laterally defined by the substrate 100, the second bonding member 101b, and the barrier member 204. In this manner, the semiconductor package 20 of FIG. 2 may be manufactured.

Figure 7A:
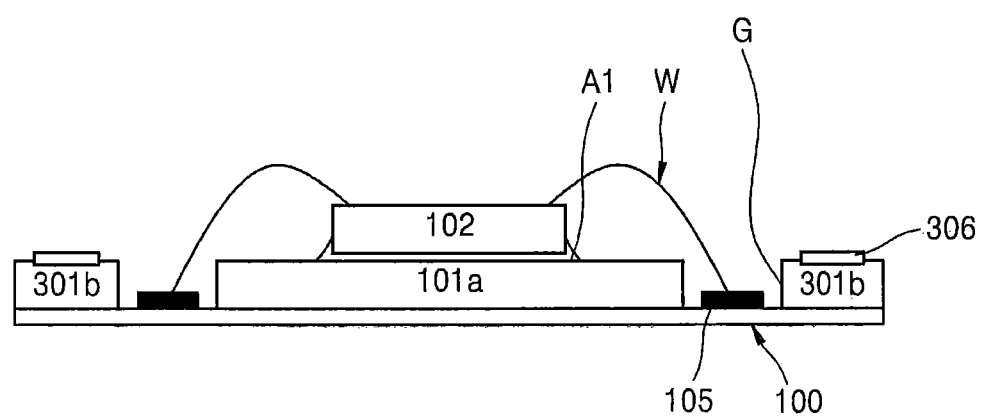
FIGS. 7A to 7C are cross-sectional views illustrating a method of manufacturing the semiconductor package illustrated in FIGS. 3A and 3B.
Figure 7B:
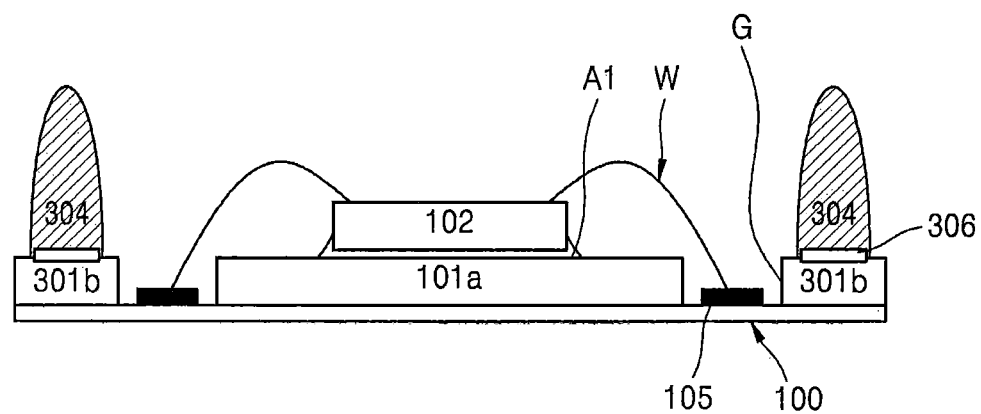
Figure 7C:
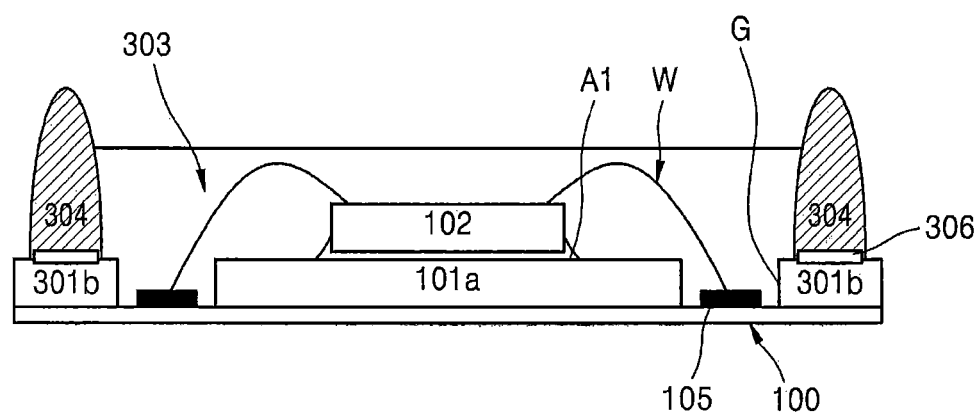

FIGS. 7A to 7C are cross-sectional views for describing a method of manufacturing the semiconductor package 30 illustrated in FIGS. 3A and 3B. Methods of manufacturing the semiconductor packages 50, 50A, and 50B illustrated in FIGS. 5A to 5C are described with reference to FIGS. 6A to 8C.

Referring to FIG. 7A, a semiconductor chip 102 and a metal pattern layer 306 may be disposed on a substrate 100. Specifically, a first bonding member 101a may be disposed on the substrate 100, and the semiconductor chip 102 may be disposed on the first bonding member 101a. An adhesive layer A1 may be disposed on the first bonding member 101a to fix the semiconductor chip 102 to the first bonding member 101a, but the present embodiment is not limited thereto. That is, various bonding methods may be used for fixing the semiconductor chip 102 to the substrate 100. In some embodiments, the first bonding member 101a may be omitted, and the semiconductor chip 102 may be directly fixed to the substrate 100 by an adhesive layer A1. Alternatively, the first bonding member 101a may be a glue in itself. In this case, the adhesive layer A1 may be omitted, and the semiconductor chip 102 may be directly fixed to the substrate 100 via the first bonding member 101a.

A second bonding member 301b may be disposed on the substrate 100, and a metal pattern layer 306 may be disposed on the second bonding member 301b. A top surface of the second bonding member 301b, on which the metal pattern layer 306 is disposed, may have a planar shape, but is not limited thereto. The top surface of the second bonding member 301b, on which the metal pattern layer 306 is disposed, may have a concave-convex shape. Specifically, the top surface of the second bonding member 301b may have a concave shape to accommodate the metal pattern layer 306 entirely or partially. The metal pattern layer 306 may include a metal, for example, copper that is capable of fixing a plurality of solders to the second bonding member 301b.

As described above, the second bonding member 301b may be spaced apart from the first bonding member 101a on the substrate 100 while surrounding the first bonding member 101a. Accordingly, a groove G may be formed in the substrate 100 along a space laterally defined by the first bonding member 101a and the second bonding member 301b spaced apart from each other. An electrode pad 105 may be formed on the substrate 100, and the electrode pad 105 may be exposed via the groove G. The electrode pad 105 may be electrically connected to an external connection terminal of the semiconductor package 10.

Referring to FIG. 7B, a barrier member 304 may be disposed on the second bonding member 301b. The barrier member 304 may be disposed on the second bonding member 301b to cover the metal pattern layer 306 on the second bonding member 301b. In this case, the barrier member 304 may be formed through a solder print process. That is, the barrier member 304 may include a solder. In some embodiments, the solder may be a metal or an alloy. The barrier member 304 including the solder may be more tightly bonded through a reflow process.

Referring to FIG. 7C, a sealing member 303 may be formed in a space laterally defined by the substrate 100, the second bonding member 301b, and the barrier member 304. The sealing member 303 may be formed through a dotting process or a molding process to seal the first bonding member 101a, the electrode pad 105, the semiconductor chip 102, and the lead wire W. In this manner, the semiconductor package 30 of FIG. 3 may be manufactured.

Figure 8A:
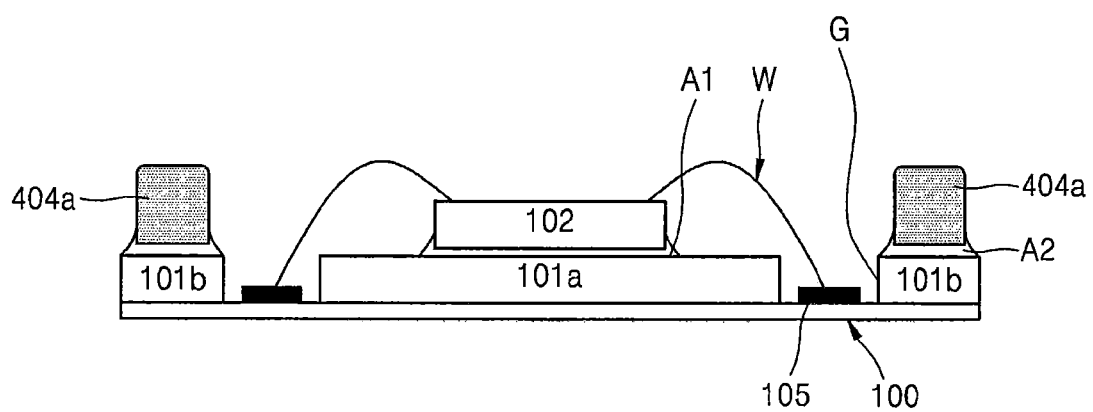
FIGS. 8A and 8B are cross-sectional views illustrating a method of manufacturing the semiconductor package illustrated in FIG. 4.
Figure 8B:
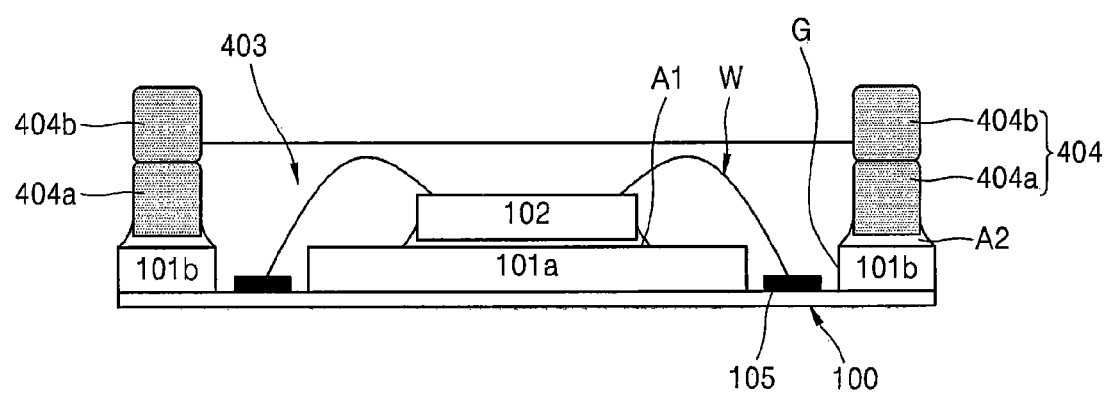

FIGS. 8A and 8B are cross-sectional views for describing a method of manufacturing the semiconductor package 40 illustrated in FIG. 4. As described with reference to FIG. 7A, first and second bonding members 101a and 101b may be formed on a substrate 100. A semiconductor chip 102 may be fixed to the first bonding member 101a by an adhesive layer A1. An adhesive layer A2 may be formed on the second bonding member 101b. Subsequent processes will be described with reference to FIGS. 8A and 8B.

Referring to FIG. 8A, a first barrier element 404a may be disposed on the adhesive layer A2 formed on the second bonding member 101b. The first barrier element 404a may have a ring-shaped structure. In this case, the ring-shaped structure may be a pre-manufactured independent ring-shaped structure. That is, the first barrier element 404a may be formed by fixing the pre-manufactured independent ring-shaped structure to the second bonding member 101b. However, the present embodiment is not limited thereto. The first barrier element 404a may be directly formed on the second bonding member 101b.

Referring to FIG. 8B, a second barrier element 404b, which is a ring-shaped structure, may be laminated on the first barrier element 404a. In this case, the ring-shaped structure may be a pre-manufactured independent ring-shaped structure. That is, the second barrier element 404b may be formed by fixing the pre-manufactured independent ring-shaped structure to the first barrier element 404a to vertically stack thereon. However, the present embodiment is not limited thereto. The second barrier element 404b may be directly formed on the first barrier element 404a.

An adhesive layer may be further formed between the first barrier element 404a and the second barrier element 404b to connect the second barrier element 404b to the first barrier element 404a.

Before or after the first and second barrier elements 404a and 404b are formed, a wire bonding process may be performed to connect the semiconductor chip 102 to an electrode pad 105.

A sealing member 403 may be formed in a space laterally defined by the substrate 100, the second bonding member 101b, and the first and second barrier elements 404a and 404b. The sealing member 403 may be formed through a dotting process or a molding process. In this manner, the semiconductor package 40 of FIG. 4 may be manufactured.

The methods of manufacturing the semiconductor packages 50, 50A, and 50B illustrated in FIGS. 5A to 5C will be described with reference to FIGS. 7A to 8C.

As described with reference to FIG. 7A, first and second bonding members 101a and 301b may be formed on a substrate 100. A semiconductor chip 102 may be fixed to the first bonding member 101a by an adhesive layer A1. An adhesive layer A2 may be formed on the second bonding member 101b.

Referring to FIGS. 5A and 7A, an adhesive layer A3 may be formed on the second bonding member 501b1 corresponding to the first barrier member 504a, and a metal pattern layer 506 may be formed on the second bonding member 501b2 corresponding to the second barrier member 504b.

In this case, the top surface of the second bonding member 501b1 corresponding to the first barrier member 504a may have a planar shape. In addition, the top surface of the second bonding member 501b2 corresponding to the second barrier member 504b may have a ring shape so as to accommodate the metal pattern layer 506 entirely or partially.

The first barrier member 504a may be a pre-manufactured independent ring-shaped structure. In this case, the first barrier member 504a may be an arc-shaped structure that surrounds the semiconductor chip 102.

The second barrier member 504b may be a solder formed by a solder print process and a reflow process. In this case, the second barrier member 504b may be an arc-shaped structure that surrounds the semiconductor chip 102. An end of the first barrier member 504a and an end of the second barrier member 504b may be connected to each other to form a space isolated in a lateral direction.

A sealing member 503 may be formed in a space laterally defined by the substrate 100, the second bonding members 501b1 and 501b2, and the first and second barrier members 504a and 504b. In this manner, the semiconductor package 50 of FIG. 5A may be manufactured.

In the semiconductor packages 50A and 50 illustrated in FIGS. 5B and 5C, lengths of the first and second barrier members 504a' and 504b' may be different from lengths of the first and second barrier members 504a" and 504b". The adhesive layer A3 or the metal pattern layer 506 may be formed corresponding to the lengths of the first and second barrier members 504a' and 504b' and the first and second barrier members 504a" and 504b" on the second bonding members 501b1 and 501b2.

The first and second barrier members 504a' and 504b' and the first and second barrier members 504a" and 504b" may be respectively formed on the adhesive layer A3 or the metal pattern layer 506. A sealing member 503 may be formed in a space laterally defined by the second bonding members 501b1 and 501b2 and the first and second barrier members 504a' and 504b' or the first and second barrier members 504a" and 504b". In this manner, the semiconductor packages 50A and 50B of FIGS. 5B and 5C may be manufactured.

FIG. 9 is a perspective view of a smart card 1000 according to embodiments.

Referring to FIG. 9, the smart card 1000 may include a semiconductor package 1 and a base substrate 2 on which the semiconductor package 1 is to be mounted.

The semiconductor package 1 may be one of the semiconductor packages 10, 20, 30, 40, 50, 50A, and 50B respectively. A substrate SUB of the semiconductor package 1 may be one of the substrates 100 included in the semiconductor packages 10, 20, 30, 40, 50, 50A, and 50B.

Referring to FIGS. 1A to 5C and 9, the semiconductor chip 102 may be mounted on the first surface 100S1 of the substrate 100, and an external connection terminal EP may be formed on the second surface 100S2 opposite to the first surface 100S1 of the substrate 100. In FIG. 9, a first surface of the substrate SUB, on which the semiconductor chip is mounted, is directed downward. The external connection terminal EP is disposed on the second surface opposite to the first surface of the substrate SUB. The external connection terminal EP may be a conductive pattern.

The base substrate 2 may include a groove EG corresponding to the semiconductor package 1 to accommodate the semiconductor package 1. The semiconductor package 1 may be mounted within the groove EG of the base substrate 2. In the process of mounting the semiconductor package 1, the surface of the semiconductor package 1, on which the semiconductor chip, the barrier member, and the sealing member are mounted, faces the groove EG of the base substrate 2. Accordingly, the surface of the semiconductor package 1, on which the external connection terminal EP is formed, may be exposed to the outside.

Figure 10:
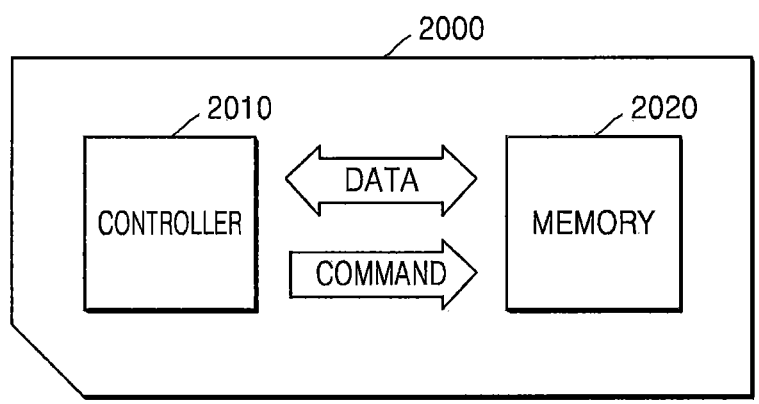
FIG. 10 is a block diagram of a smart card including a semiconductor package, according to embodiments.

FIG. 10 is a perspective view of a smart card 2000 according to embodiments.

Referring to FIG. 10, a controller 2010 and a memory 2020 may be configured to exchange electrical signals with each other. For example, the controller 2010 and the memory 2020 may be configured to exchange data with each other according to a command of the controller 2010. The smart card 2000 may communicate with an external device in a non-contact or contact manner and store data in the memory 2020 or output data from the memory 2020 to the external device. For example, the memory 2020 may include at least one selected from among the semiconductor packages 10, 20, 30, 40, 50, 50A, and 50B.

The smart card 2000 may be used for a memory card serving as a data storage medium or a credit card capable of inputting and outputting information. For example, the memory card may include a multimedia card (MMC) or a secure digital (SD) card.

While the inventive concept has been particularly shown and described with reference to embodiments thereof, it will be understood that various changes in form and details may be made therein without departing from the spirit and scope of the following claims.

What is claimed:

1. A semiconductor package comprising:
a substrate;
a first bonding member on the substrate;
a second bonding member on the substrate and spaced apart from the first bonding member to surround the first bonding member;
a semiconductor chip on the first bonding member;
a barrier member on the second bonding member to surround the semiconductor chip;
a groove defined by a space bounded by the first bonding member, the second bonding member and the substrate; and
a sealing member sealing the groove, the first bonding member, and the semiconductor chip in a space between the substrate, the second bonding member, and the barrier member;
wherein the barrier member comprises a plurality of separate barrier elements, and the plurality of separate barrier elements are connected to one another to provide the barrier member;
wherein the plurality of separate barrier elements are ring-shaped structures, and the barrier member is provided by vertically stacking the ring-shaped structures.

2. The semiconductor package of claim 1, further comprising:
an electrode pad on the substrate in the groove; and
a lead wire electrically connecting the semiconductor chip to the electrode pad,
wherein the lead wire extends in the groove to the electrode pad, and
the sealing member fills the groove and seals the electrode pad and the lead wire.

3. The semiconductor package of claim 2, wherein a depth of the groove is greater than a thickness of the electrode pad.

4. The semiconductor package of claim 1, wherein the barrier member comprises a ring-shaped barrier member, and the semiconductor chip is in an interior portion of the ring-shaped barrier member.

5. The semiconductor package of claim 1, wherein a cross-section of the barrier member has a rectangular shape or a bullet shape.

6. The semiconductor package of claim 1, wherein at least one of the first bonding member and the second bonding member comprises a glue.

7. The semiconductor package of claim 1, wherein the plurality of separate barrier elements are arc-shaped structures, and the barrier member is provided by connecting ends of the arc-shaped structures to one another.

8. The semiconductor package of claim 7, wherein at least one of the arc-shaped structures comprises a solder structure.

9. The semiconductor package of claim 1, wherein the barrier member comprises an integral solder structure.

10. The semiconductor package of claim 9, further comprising a metal pattern layer between the barrier member and the second bonding member.

11. The semiconductor package of claim 10, wherein a top surface of the second bonding member has a concave shape to recess the metal pattern layer entirely or partially in the top surface.

12. The semiconductor package of claim 1, wherein the barrier member comprises at least one of a ceramic, plastic, and a metal.

13. A semiconductor package comprising:
a substrate;
a semiconductor chip on the substrate;
an integral solder structure provided on the substrate to surround the semiconductor chip;
a sealing member sealing the semiconductor chip in a space between the substrate and the integral solder structure;
wherein the integral solder structure comprises a plurality of barrier elements separately formed and integrated with one another to provide the integral solder structure; and
wherein the plurality of barrier elements comprise respective ring-shaped barrier members vertically stacked on one another.

14. A semiconductor package comprising:
a semiconductor chip on a substrate inside the semiconductor package;
an electrode pad spaced apart from the semiconductor chip on the substrate inside the semiconductor package;
a wire, inside the semiconductor package, connecting the electrode pad to the semiconductor chip;
a barrier member on the substrate fencing-in the semiconductor chip, the electrode pad, and the wire in an interior portion of the substrate; and
a sealing material in the interior portion of the substrate fenced-in by the barrier member, the sealing material covering the semiconductor chip, the electrode pad, and the wire,
a bonding member beneath the barrier member, the bonding member being a separate structure from the barrier member; and
wherein a maximum height of the barrier member is greater than a maximum height of each of the sealing material, the semiconductor chip over the interior portion of the substrate, and the wire over the interior portion of the substrate, and the maximum height of the sealing material is greater than a maximum height of the bonding member.

15. The semiconductor package of claim 14,
wherein each of the barrier member and the bonding member has a ring shape, a diameter of the ring shape of the barrier member is greater than a diameter of the ring shape of the bonding member.

16. The semiconductor package of claim 14 wherein the barrier member comprises a plurality of separate barrier elements arranged in a polygonal shape on the substrate and joined together by intervening separate structures.

17. The semiconductor package of claim 16 wherein plurality of separate barrier elements each have a different cross-sectional shape.

* * * * *